(12) United States Patent
Argyres (10) Patent No.: US 8,462,532 B1
(45) Date of Patent: Jun. 11, 2013

(54) FAST QUATERNARY CONTENT ADDRESSABLE MEMORY CELL

(75) Inventor: Dimitri Argyres, San Jose, CA (US)

(73) Assignee: Netlogic Microsystems, Inc., Santa Clara, CA (US)

( * ) Notice: Subject to any disclaimer, the term of this patent is extended or adjusted under 35 U.S.C. 154(b) by 153 days.

(21) Appl. No.: 13/015,543

(22) Filed: Jan. 27, 2011

Related U.S. Application Data (60) Provisional application No. 61/378,808, filed on Aug. 31, 2010.

(51) Int. Cl.
*G11C 15/00* (2006.01)

(52) U.S. Cl.
USPC ........ 365/49.1; 365/49.17; 365/154; 711/108

(58) Field of Classification Search
USPC .................. 365/49.1, 49.17, 154; 711/108
See application file for complete search history.

(56) References Cited

U.S. PATENT DOCUMENTS

| | | | |
|---|---|---|---|
| 3,665,422 A | 5/1972 | McCoy et al. |
| 4,112,502 A | 9/1978 | Scheuneman |
| 4,747,080 A | 5/1988 | Yamada |
| 4,779,226 A | 10/1988 | Haraszti |
| 4,791,606 A | 12/1988 | Threewitt et al. |
| 4,903,268 A | 2/1990 | Hidaka et al. |
| 4,958,352 A | 9/1990 | Noguchi et al. |
| 4,991,136 A | 2/1991 | Mihara |
| 5,046,046 A | 9/1991 | Sweha et al. |
| 5,127,014 A | 6/1992 | Raynham |
| 5,184,325 A | 2/1993 | Lipovski |
| 5,233,614 A | 8/1993 | Singh |
| 5,311,462 A | 5/1994 | Wells |
| 5,319,589 A | 6/1994 | Yamagata et al. |
| 5,319,590 A | 6/1994 | Montoye |
| 5,450,424 A | 9/1995 | Okugaki et al. |
| 5,452,243 A | 9/1995 | Ansel et al. |
| 5,455,834 A | 10/1995 | Chang et al. |
| 5,469,450 A | 11/1995 | Cho et al. |
| 5,491,703 A | 2/1996 | Barnaby et al. |
| 5,561,429 A | 10/1996 | Halberstam et al. |
| 5,570,377 A | 10/1996 | Gonzalez et al. |
| 5,572,460 A | 11/1996 | Lien |
| 5,604,753 A | 2/1997 | Bauer et al. |
| 5,629,950 A | 5/1997 | Godiwala et al. |
| 5,642,320 A | 6/1997 | Jang |
| 5,644,583 A | 7/1997 | Garcia et al. |
| 5,682,394 A | 10/1997 | Blake et al. |

(Continued)

OTHER PUBLICATIONS

U.S. Appl. No. 13/216,104, filed Aug. 23, 2011, Quaternary Content Addressable Memory Cell Having One Transistor Pull-Down Stack, Dimitri Argyres.

(Continued)

*Primary Examiner* — Pho M Luu
*Assistant Examiner* — Thao Bui
(74) *Attorney, Agent, or Firm* — Sterne, Kessler, Goldstein & Fox P.L.L.C.

(57) ABSTRACT

Quaternary CAM cells are provided that include one or more compare circuits that each has a minimal number of pull-down transistors coupled between the match line and ground potential. For some embodiments, the compare circuit includes two parallel paths between the match line and ground potential, with each parallel path consisting of a single pull-down transistor having a gate selectively coupled to the stored data value in response to a comparand value.

17 Claims, 5 Drawing Sheets

U.S. PATENT DOCUMENTS

| | | | |
|---|---|---|---|
| 5,699,369 A | 12/1997 | Guha | |
| 5,724,296 A | 3/1998 | Jang | |
| 5,727,003 A | 3/1998 | Zook | |
| 5,761,222 A | 6/1998 | Baldi | |
| 5,796,671 A | 8/1998 | Wahlstrom | |
| 5,796,758 A | 8/1998 | Levitan | |
| 5,872,802 A | 2/1999 | Knaack et al. | |
| 5,890,201 A * | 3/1999 | McLellan et al. | 711/108 |
| 6,009,548 A | 12/1999 | Chen et al. | |
| 6,032,214 A | 2/2000 | Farmwald et al. | |
| 6,058,500 A | 5/2000 | DesJardins et al. | |
| 6,067,656 A | 5/2000 | Rusu et al. | |
| 6,128,207 A | 10/2000 | Lien et al. | |
| 6,134,631 A | 10/2000 | Jennings, III | |
| 6,137,707 A | 10/2000 | Srinivasan et al. | |
| 6,151,247 A | 11/2000 | Estakhri et al. | |
| 6,154,384 A | 11/2000 | Nataraj et al. | |
| 6,188,629 B1 | 2/2001 | Kaplinsky | |
| 6,199,140 B1 | 3/2001 | Srinivasan et al. | |
| 6,216,246 B1 | 4/2001 | Shau | |
| 6,219,815 B1 | 4/2001 | DesJardins et al. | |
| 6,233,717 B1 | 5/2001 | Choi | |
| 6,243,281 B1 | 6/2001 | Pereira | |
| 6,262,907 B1 * | 7/2001 | Lien et al. | 365/49.12 |
| 6,289,471 B1 | 9/2001 | Gordon | |
| 6,324,087 B1 | 11/2001 | Pereira | |
| 6,362,990 B1 | 3/2002 | Gibson et al. | |
| 6,362,993 B1 | 3/2002 | Henderson et al. | |
| 6,374,325 B1 | 4/2002 | Simpson et al. | |
| 6,381,191 B2 | 4/2002 | Ooishi | |
| 6,385,070 B1 | 5/2002 | Peterson | |
| 6,397,290 B1 | 5/2002 | Williams et al. | |
| 6,400,593 B1 | 6/2002 | Lien et al. | |
| 6,408,417 B1 | 6/2002 | Moudgal et al. | |
| 6,418,042 B1 | 7/2002 | Srinivasan et al. | |
| 6,421,265 B1 | 7/2002 | Lien et al. | |
| 6,430,073 B1 | 8/2002 | Batson et al. | |
| 6,434,033 B1 | 8/2002 | Chien | |
| 6,460,112 B1 | 10/2002 | Srinivasan et al. | |
| 6,470,418 B1 | 10/2002 | Lien et al. | |
| 6,477,615 B1 | 11/2002 | Tanaka | |
| 6,480,406 B1 | 11/2002 | Jin et al. | |
| 6,496,399 B1 | 12/2002 | Choi et al. | |
| 6,505,270 B1 | 1/2003 | Voelkel et al. | |
| 6,538,911 B1 | 3/2003 | Allan et al. | |
| 6,542,391 B2 | 4/2003 | Pereira et al. | |
| 6,560,156 B2 | 5/2003 | Lien et al. | 365/222 |
| 6,563,754 B1 | 5/2003 | Lien et al. | |
| 6,564,754 B1 | 5/2003 | Cohen | |
| 6,597,595 B1 | 7/2003 | Ichiriu et al. | |
| 6,618,281 B1 | 9/2003 | Gordon | |
| 6,646,900 B2 | 11/2003 | Tsuda et al. | |
| 6,665,220 B2 | 12/2003 | Vlasenko | |
| 6,690,595 B1 | 2/2004 | Srinivasan et al. | |
| 6,700,810 B1 | 3/2004 | Ichiriu et al. | |
| 6,700,827 B2 | 3/2004 | Lien et al. | 365/222 |
| 6,707,693 B1 | 3/2004 | Ichiriu | |
| 6,721,202 B1 | 4/2004 | Roge et al. | |
| 6,728,124 B1 | 4/2004 | Ichiriu et al. | |
| 6,741,253 B2 | 5/2004 | Radke et al. | |
| 6,760,241 B1 | 7/2004 | Gharia | |
| 6,760,881 B2 | 7/2004 | Batson et al. | |
| 6,775,168 B1 | 8/2004 | Park et al. | |
| 6,807,077 B2 | 10/2004 | Noda et al. | |
| 6,842,360 B1 | 1/2005 | Srinivasan | |
| 6,845,026 B1 | 1/2005 | Gharia | |
| 6,856,527 B1 * | 2/2005 | Srinivasan et al. | 365/49.1 |
| 6,865,098 B1 | 3/2005 | Ichiriu et al. | 365/49 |
| 6,867,989 B1 | 3/2005 | Roy | |
| 6,888,731 B2 | 5/2005 | Roth et al. | |
| 6,900,999 B1 | 5/2005 | Yen et al. | |
| 7,009,862 B2 | 3/2006 | Higeta et al. | |
| 7,050,318 B1 | 5/2006 | Argyres | |
| 7,133,302 B1 | 11/2006 | Srinivasan et al. | |
| 7,298,635 B1 | 11/2007 | Maheshwari | |
| 7,433,217 B1 * | 10/2008 | Maheshwarl | 365/49.17 |
| 7,499,303 B2 | 3/2009 | Lien et al. | |
| 7,924,588 B2 | 4/2011 | Arsovski et al. | |
| 7,944,724 B2 | 5/2011 | Chu | |

OTHER PUBLICATIONS

Application Note An-94 "Error Detection and Correction with IDT49C466", released by Integrated Device Technology, Inc., pp. 131-141, (1996).

F. Halsall, Data Communications, Computer Networks and OSI, 2d. Ed., pp. 499-508, Addison-Wesley Publ. Co. (1998).

Fourouzan, Behrouz, "Introduction to Telecommunications and Networking." Chapter 8, pp. 194-226, Aug. 1997.

Kalter et al., "A 50-ns 16-Mb DRAM with a 10-ns Data Rate and On-Chip ECC," IEEE Journal of Solid-State Circuits vol. 25, No. 5, Oct. 1990 pp. 1118-1127.

SiberCore Technologies, Soft Error in TCAMS: Causes and Cures, Jul. 2003, 5 pages.

Non-Final Action, dated Nov. 23, 2012, for U.S. Appl. No. 13/149,878, filed May 31, 2011, 5 pages.

Notice of Allowance, dated Oct. 10, 2012, for U.S. Appl. No. 13/149,885, filed May 31, 2011, 9 pages.

U.S. Appl. No. 13/149,878, entitled "Ternary Contest Addressable Memory Cell Having Single Transistor Pull-Down Stack," filed May 31, 2011.

U.S. Appl. No. 13/149,885, entitled "Ternary Contest Addressable Memory Cell Having Two Transistor Pull-Down Stack," filed May 31, 2011.

U.S. Appl. No. 13/216,104, entitled "Quaternary Content Addressable Memory Cell having One Transistor Pull-Down Stack," filed Aug. 23, 2011.

Notice of Allowance, dated Mar. 7, 2013, for U.S. Appl. No. 13/149,878, filed May 31, 2011, 5 pages.

Notice of Allowance, dated Jan. 29, 2013, for U.S. Appl. No. 13/149,885, filed May 31, 2011, 5 pages.

* cited by examiner

FAST QUATERNARY CONTENT ADDRESSABLE MEMORY CELL

CROSS-REFERENCE TO RELATED APPLICATION

This application claims the benefit under 35 USC 119(e) of the co-pending and commonly owned U.S. Provisional Application No. 61/378,808 entitled "Fast Quaternary CAM Cell" filed on Aug. 31, 2010, which is incorporated herein by reference.

TECHNICAL FIELD

The present embodiments generally relate to content addressable memory (CAM) devices, and more particularly to quaternary CAM cells.

BACKGROUND

Content addressable memory (CAM) devices are frequently used in network switching and routing applications to determine forwarding destinations for data packets. A CAM device can be instructed to compare a selected portion of an incoming packet (e.g., a destination address extracted from the packet header) with CAM words (e.g., forwarding address) stored in an array within the CAM device. If there is a matching entry stored in the CAM array, the index of the matching CAM word can be used to access a corresponding location in an associated memory device to retrieve a destination address and/or other routing information for the packet.

A CAM device includes a CAM array having a plurality of CAM cells organized in a number of rows and columns. Each row of CAM cells, which can be used to store a CAM word, is coupled to a corresponding match line that indicates match results for the row. Each column of CAM cells is typically coupled to one or more data lines or data line pairs that can be used to drive data into a selected CAM row during write operations and/or for providing a search key to the CAM rows during compare operations. During a compare operation, the search key (e.g., the comparand word) is provided to the CAM array and compared with the CAM words stored therein. For each CAM word that matches the search key, a corresponding match line is asserted to indicate the match result. If any of the match lines are asserted, a match flag is asserted to indicate the match condition, and a priority encoder determines the match address or index of the highest priority matching entry in the CAM array.

CAM arrays typically include either binary CAM cells that store binary data values (i.e., a logic "1" or a logic "0" value) or ternary CAM cells that store ternary data values (i.e., a logic "1" value, a logic "0" values, or a don't care value). Ternary CAM cells store a data bit and a mask bit. For example, when a mask bit within a ternary CAM cell is inactive (e.g., set to a logic 1 value), the ternary CAM cell operates as a conventional binary CAM cell storing an "unmasked" data bit. When the mask bit is active (e.g., set to a logic 0 value), the ternary CAM cell is treated as storing a "don't care" value, which means that all compare operations performed on the actively masked ternary CAM cell will result in a cell match condition.

Figure 1A:
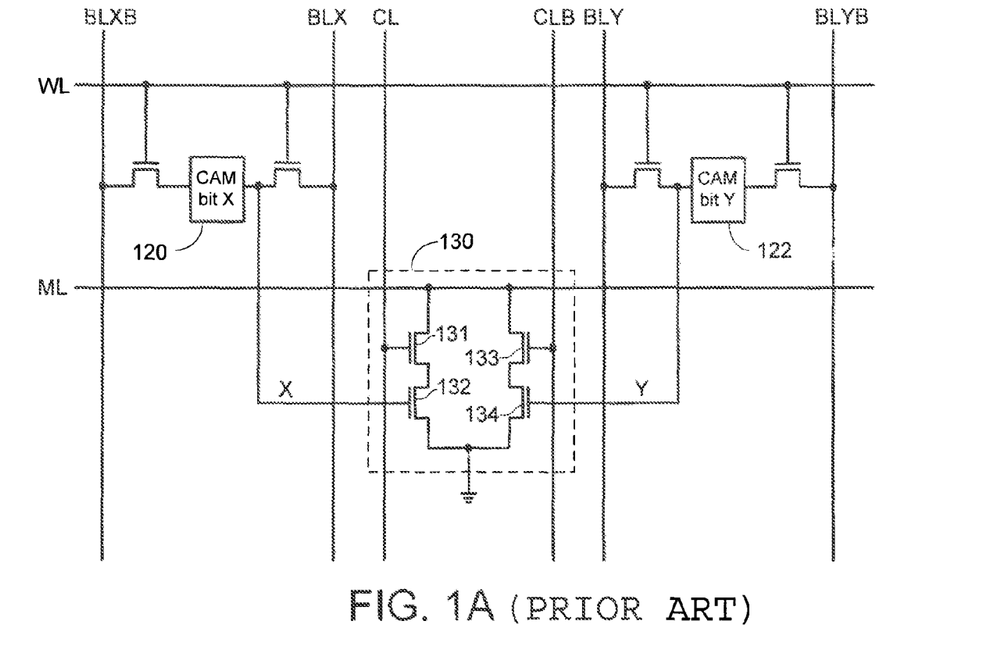
FIG. 1A is circuit diagram of a conventional quaternary (XY) CAM cell.
Figure 1B:
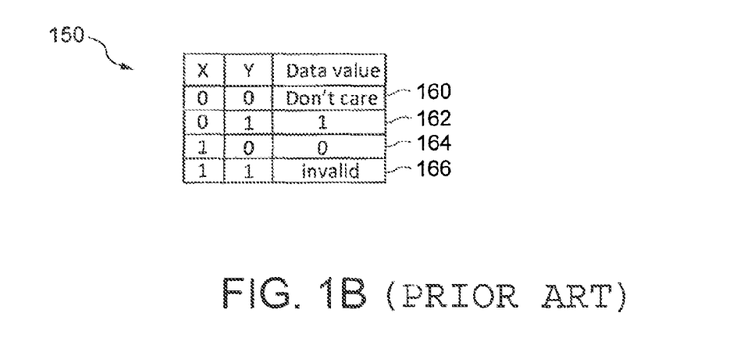
FIG. 1B shows a truth table for conventional data storage of the XY CAM cell of FIG. 1A.

FIG. 1A shows a well-known quaternary CAM cell 100 of the type described in U.S. Pat. No. 5,319,590 issued to Montoye, the disclosure of which is incorporated herein by reference. Quaternary CAM cells, which are also referred to as XY CAM cells, include two storage cells 120 and 122 coupled to a compare circuit 130. The two data bits X and Y can collectively represent four possible states: "0", "1", "don't care", and a fourth state which may be left unused or may indicate "invalid," as depicted in FIG. 1B. The logic "0" and "1" states correspond to the logic states represented, for example, by a conventional binary CAM cell. For each of these states, if the comparand data (e.g., provided to CAM cell 100 via complementary comparand lines CL and CLB) matches the data stored in CAM cell 100, compare circuit 130 does not discharge the match line ML, which indicates a match condition. Conversely, if the comparand data does not match the data stored in CAM cell 100, compare circuit 130 discharges ML (e.g., toward ground potential) to indicate the mismatch condition. For the "don't care" state, the logic low values for X and Y maintain respective transistors 132 and 134 in non-conductive states, thereby preventing compare circuit 130 from discharging ML. In this manner, data stored in CAM cell 100 is masked from the compare operation, thereby forcing a match condition for CAM cell 100, regardless of the comparand data. For the "invalid" state, the logic high values for X and Y maintain respective transistors 132 and 134 in conductive states. During a compare operation, one of the complementary comparand data bit pair provided on CL/CLB will be logic high, thereby causing compare circuit 130 to discharge ML to indicate the mismatch state, regardless of the comparand data.

Note that the XY CAM cell 100 stores a data value as a complimentary bit pair, where the Y bit stores the binary data value and the X bit stores the complemented binary data value. This allows XY CAM cell 100 to perform faster compare operations than conventional ternary CAM cells.

However, to keep up with demand for ever-increasing search rates, it would be desirable to increase the speed of XY CAM cells.

BRIEF DESCRIPTION OF THE DRAWINGS

Present embodiments are illustrated by way of example, and not by way of limitation, in the figures of the accompanying drawings and in which like reference numerals refer to similar elements and in which.

DETAILED DESCRIPTION

Fast quaternary (XY) CAM cells including compare circuits having a reduced stack are disclosed. These CAM cells can be used in a wide variety of CAM architectures and applications for which speed is important. In the following description, for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present embodiments unnecessarily.

Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present embodiments are not to be construed as limited to specific examples described herein but rather includes within its scope all embodiments defined by the appended claims.

More specifically, CAM cells architected in accordance with present embodiments include a compare circuit that has a fewer number of pull-down transistors coupled between the match line and ground potential than conventional CAM cells, which in turn increases the speed of compare operations performed by such CAM cells. More specifically, by reducing the size of the pull-down stack of the CAM cell's compare circuit, the capacitive load on the match line is reduced, which in turn allows the match line to be charged and discharged more quickly than CAM cells having larger compare stacks. In addition, reducing the number of pull-down transistors between the match line and ground potential also reduces the resistance of the compare stack, which increases search speeds. Further, the reduced match line capacitance resulting from the fewer number of pull-down transistors in the compare stack may also reduce power consumption.

Figure 2:
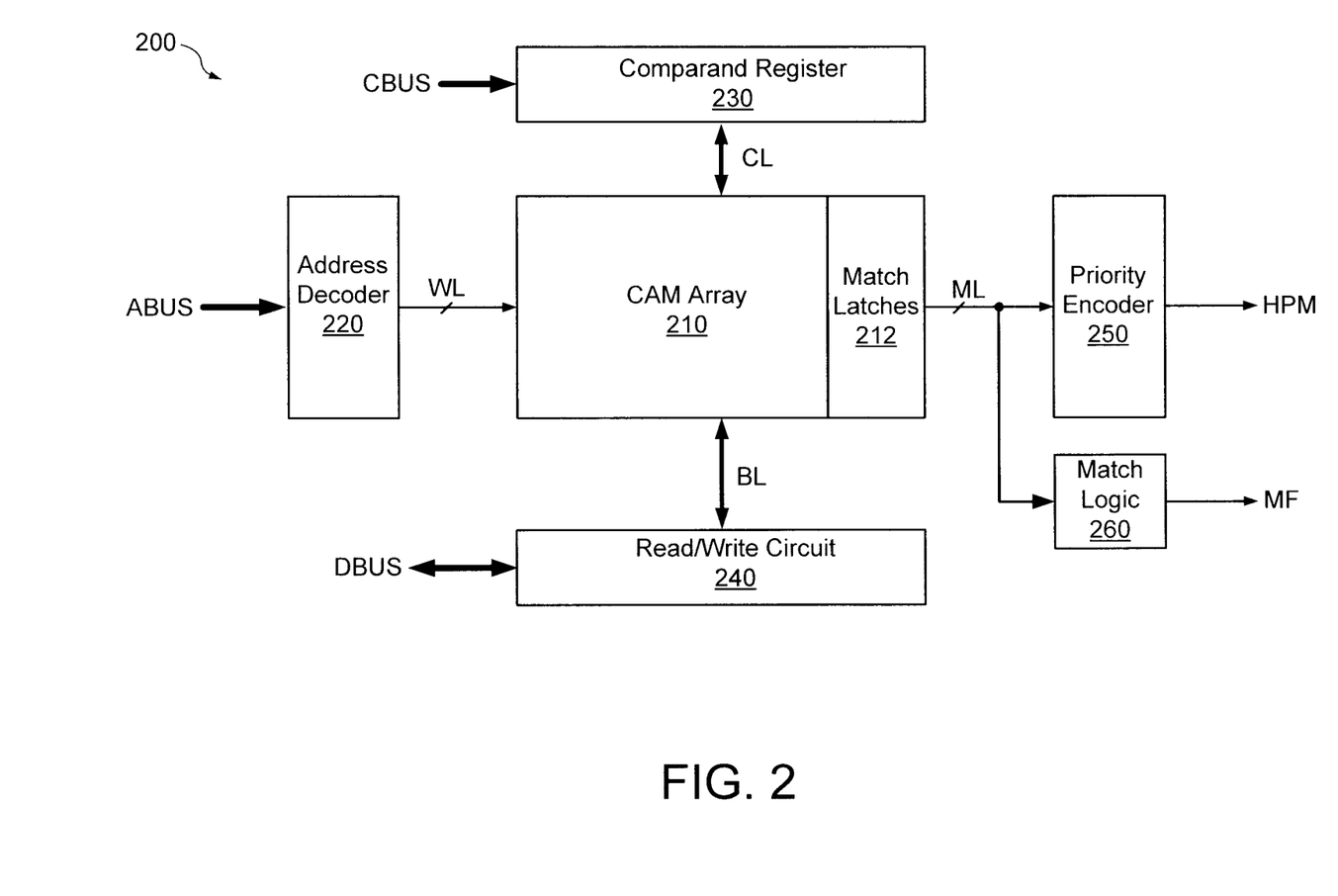
FIG. 2 is a block diagram of a CAM device within which the present embodiments may be implemented.

FIG. 2 is a block diagram of a CAM device within which CAM cells of present embodiments may be implemented. CAM device 200 includes a CAM array 210, an address decoder 220, a comparand register 230, a read/write circuit 240, a priority encoder circuit 250, and match logic 260. CAM array 210 includes any number of rows of CAM cells (not shown for simplicity in FIG. 2), where each row of CAM cells can be configured to store a data word. Further, while CAM array 210 is shown in FIG. 2 as a single CAM array, it may include any number of CAM array blocks that can be independently searched.

One or more instructions and related control signals may be provided to CAM device 200 from an instruction decoder (not shown for simplicity) to control read, write, compare, and other operations for CAM device 200. Other well-known signals that can be provided to CAM device 200, such as enable signals, clock signals, and power connections, are not shown for simplicity. Further, although not shown in FIG. 2, each row of CAM cells in CAM array 210 may have one or more validity bits to indicate whether the corresponding row (or any segment thereof) of CAM cells stores valid data.

Each row of CAM cells (not shown in FIG. 2 for simplicity) in CAM array 210 is coupled to address decoder 220 via a corresponding word line WL, and to match latches 212, to priority encoder 250, and to well-known match logic 260 via a corresponding match line ML. For simplicity, the word lines and match lines are represented collectively in FIG. 2. Address decoder 220 is well-known, and includes circuitry to select corresponding rows in CAM array 210 for read, write, and/or other operations in response to an address received from an address bus ABUS using the word lines WL. For other embodiments, addresses may be provided to address decoder 220 from another suitable bus and/or circuitry.

The match lines ML provide match results for compare operations between comparand data (e.g., a search key) and data stored in CAM array 210. Priority encoder 250, which is well-known, uses the match results indicated on the match lines and latched in the match latches 212 to determine the matching entry that has the highest priority number associated with it and generates the index or address of this highest priority match (HPM). In addition, priority encoder 250 may use the validity bits from CAM array 210 to generate the next free address that is available in CAM array 210 for storing new data. Although not shown in FIG. 2, for some embodiments, priority encoder 250 may provide the next free address to the address decoder 220.

Match logic 260, which is well-known, uses the match results indicated on the match lines to generate a match flag (MF) indicative of a match condition in CAM array 210. If there is more than one matching entry in CAM array 210, match logic 260 may generate a multiple match flag MF to indicate a multiple match condition. In addition, match logic 260 may use the validity bits from CAM array 210 to assert a full flag when all of the rows of CAM cells in CAM array 210 are filled with valid entries.

Each column of CAM cells (not shown in FIG. 2 for simplicity) in CAM array 210 is coupled to comparand register 230 via one or more corresponding comparand lines CL, and is coupled to read/write circuit 240 via one or more corresponding bit lines BL. For simplicity, the comparand lines CL and bit lines BL are represented collectively in FIG. 2. Comparand register 230 is well-known, and is configured to provide a search key (e.g., a comparand word) received from a comparand bus CBUS to CAM array 210 during compare operations with data stored therein. For other embodiments, the search key can be provided to CAM array 210 via another bus and/or circuit. Read/write circuit 240 includes well-known write drivers to write data received from a data bus DBUS to CAM array 210 via the bit lines BL, and includes well-known sense amplifiers to read data from CAM array 210 onto DBUS. For other embodiments, read/write circuit 240 may be coupled to a bus other than DBUS. Further, although not shown in FIG. 2 for simplicity, CAM device 200 can include a well-known global mask circuit (e.g., coupled to the comparand register 230) that can selectively mask the bits of the search key provided to the CAM array 210.

Figure 3:
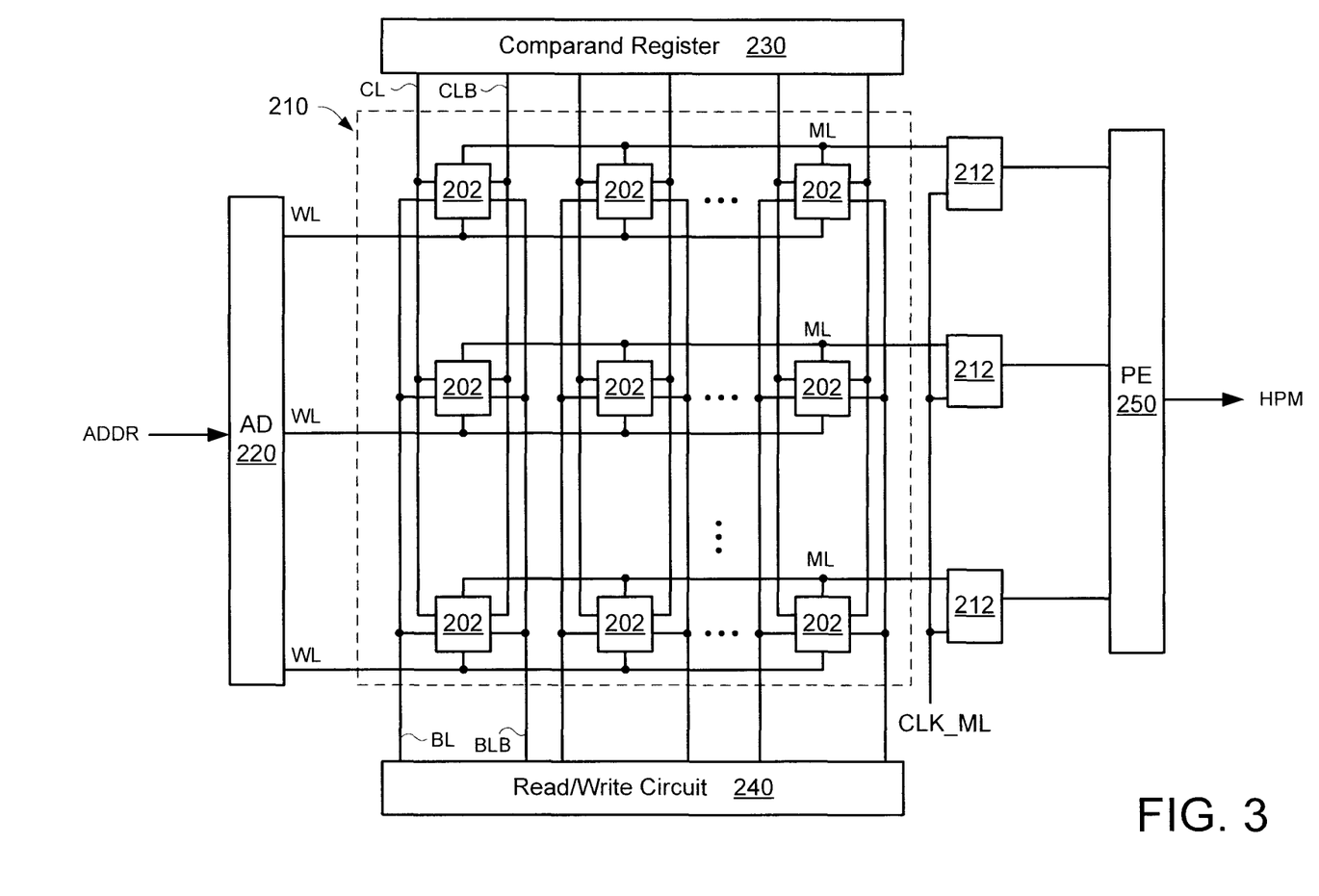
FIG. 3 is a block diagram of one embodiment of the CAM array of FIG. 2.

FIG. 3 is a more detailed block diagram of the CAM array 210 of FIG. 2. CAM array 210 is shown to include a plurality of CAM cells 202 organized in any number of rows and columns. The CAM cells 202 can be any suitable type of CAM cell including, for example, binary CAM cells, ternary CAM cells, and/or quaternary CAM cells. As noted above, each row of CAM array 210 may also include one or more validity bits. Each row of CAM cells 202 is coupled to a match line ML and to a word line WL. Each word line WL is driven by address decoder 220 (see also FIG. 2) to select one or more rows of CAM cells 202 for writing or reading. Each match line ML is coupled to priority encoder 250 via a corresponding match latch 212, which together form the match latches 212 of FIG. 2. The match latches 212 are clocked by a match latch clock signal CLK_ML in a well-known manner. Each column of CAM cells 202 in CAM array 210 is coupled to read/write circuit 240 via a complementary bit line pair BL/BLB, and to comparand register 230 via a complementary comparand line pair CL/CLB.

Prior to compare operations, the match lines are pre-charged (e.g., to logic high), and each set of complementary comparand line pairs CL/CLB are driven to the same predetermined logic level (e.g., to logic high). Then, during compare operations, the comparand register 230 provides the search key (i.e., the comparand word) to the CAM cells 202 by driving each pair of complementary comparand lines CL/CLB to opposite logic states indicative of the corresponding bit of the search key. For example, to provide a logic low comparand bit (C) to a column of CAM cells, the corresponding comparand line CL is driven to a first logic state (e.g., logic low) and the corresponding complementary comparand line CLB is driven to a second logic state (e.g., logic high);

conversely, to provide a logic high comparand bit C to the column of CAM cells, the corresponding comparand line CL is driven to the second logic state (e.g., logic high) and the corresponding complementary comparand line CLB is driven to the first logic state (e.g., logic low). Thereafter, if all the CAM cells 202 in a particular row match the corresponding bits of the search key, then the match line ML remains in its logic high state to indicate the match condition. Conversely, if one or more of the CAM cells 202 in the row do not match the corresponding bit of the search key, then mismatching CAM cells 202 discharge the match line (e.g., to ground potential) to indicate the mismatch condition.

Figure 4:
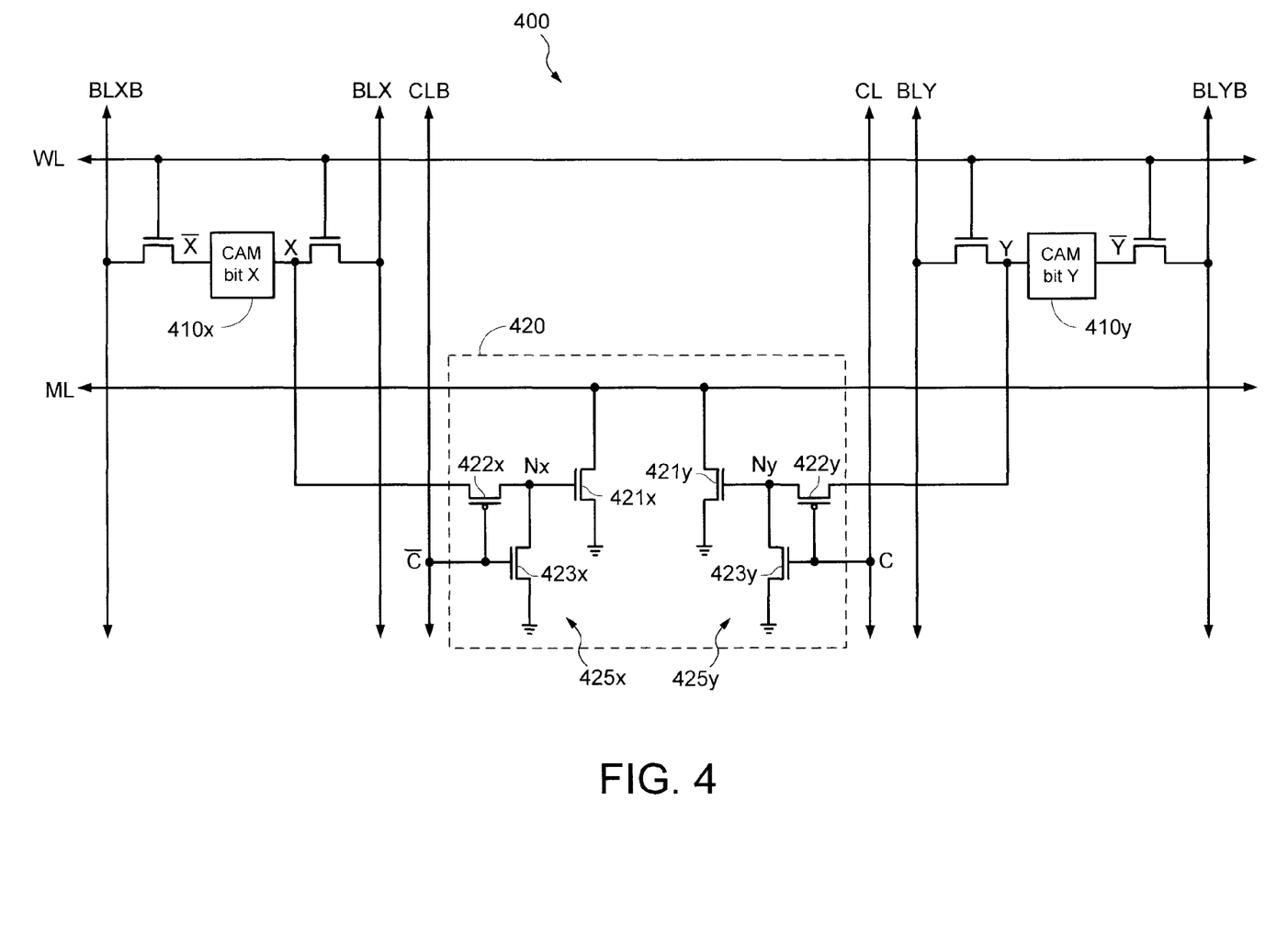
FIG. 4 is a block diagram of an XY CAM cell according to some embodiments.

FIG. 4 shows a quaternary (XY) CAM cell 400 in accordance with the present embodiments. The XY CAM cell 400 includes two memory cells 410x and 410y coupled to a compare circuit 420. The memory cells 410x and 410y can be any suitable type of storage cell including, for example, an SRAM cell, a DRAM cell, an EEPROM cell, a flash memory cell, a latch, or a register. For some embodiments, memory cells 410 are formed using cross-coupled CMOS inverter circuits, as known in the art. The first memory cell 410x stores a first data bit "X", and the second memory cell 410y stores a second data bit "Y". Together, the two data bits X and Y can collectively represent a data value D having four possible states: "0", "1", "don't care", and a fourth state which may be left unused or may indicate "invalid," as depicted in the truth table 150 of FIG. 1B.

More specifically, the logic "0" and "1" states correspond to the logic states represented by a conventional binary CAM cell. For each of these states, if the comparand data (e.g., provided to CAM cell 400 via complementary comparand lines CL and CLB) matches the data stored in CAM cell 400, the compare circuit 420 does not discharge the match line ML, which remains in its charged state to indicate a match condition. Conversely, if the comparand data does not match the data stored in CAM cell 400, compare circuit 420 discharges ML (e.g., toward ground potential) to indicate the mismatch condition. For the "don't care" state, the logic low values for X and Y cause compare circuit 420 to remain in a non-conductive state, thereby preventing the match line from discharging. In this manner, the data value D stored in CAM cell 400 is masked from the compare operation, thereby forcing a match condition for CAM cell 400, regardless of the comparand data. For the "invalid" state, the logic high values for X and Y cause the compare circuit 420 to remain in a conductive state to discharge the match line to indicate a mismatch condition, irrespective of the comparand data. For some embodiments, the "invalid" state can be used to disable a row of CAM array 210 containing one or more XY CAM cells 400, for example, as described in commonly-owned U.S. Pat. No. 6,865,098, which is incorporated by reference herein.

The compare circuit 420 includes two match line pull-down transistors 421x and 421y, two pass transistors 422x and 422y, and two gating transistors 423x and 423y. A first group of transistors 421x, 422x, and 423x form a first selective pull-down circuit 425x that selectively discharges the match line ML in response to a comparison with the complemented comparand bit (C) provided on CLB and the first data bit (X), and a second group of transistors 421y, 422y, and 423y form a second selective pull-down circuit 425y that selectively discharges the match line ML in response to a comparison with the comparand bit (C) provided on CL and the second data bit (Y).

More specifically, for the first selective pull-down circuit 425x, the NMOS match line pull-down transistor 421x is coupled between the match line and ground potential, and has a gate tied to a first node (Nx) that, in turn, is selectively coupled to receive X from the first memory cell 410x via the PMOS pass transistor 422x. The NMOS gating transistor 423x is coupled between the gate of match line pull-down transistor 421x and ground potential. The common gates of transistors 422x and 423x are coupled to the complementary comparand line CLB, and receive the complemented comparand bit (C) during compare operations. For the second selective pull-down circuit 425y, the NMOS match line pull-down transistor 421y is coupled between the match line and ground potential, and has a gate tied to a second node (Ny) that, in turn, is selectively coupled to receive Y from the second memory cell 410y via the PMOS pass transistor 422y. The NMOS gating transistor 423y is coupled between the gate of match line pull-down transistor 421y and ground potential. The common gates of transistors 422y and 423y are coupled to the comparand line CL, and receive the comparand bit (C) during compare operations.

For other embodiments, the first node Nx can be coupled to receive the complemented first data bit $\overline{X}$, the second node Ny can be coupled to receive the complemented second data bit $\overline{Y}$, the common gates of transistors 422x and 423x can receive the comparand bit $\overline{C}$, and the common gates of transistors 422y and 423y can receive the complemented comparand bit C. For such embodiments, the don't care state is obtained when X=Y=1, and the invalid state is obtained when X=Y=0.

An exemplary compare operation between a comparand bit C and a data value D stored in the CAM cell 400 is now described. During a pre-charge phase of the compare operation, the match line ML is pre-charged to logic high (e.g., towards VDD) by a suitable pre-charge circuit (not shown for simplicity), and the comparand lines CL/CLB are both pre-charged to logic high (e.g., towards VDD). The logic high state of CLB turns on NMOS transistor 423x and turns off PMOS transistor 422x. The conductive state of transistor 423x pulls the gate of match line pull-down transistor 421x (e.g., at node Nx) low towards ground potential, thereby maintaining transistor 421x in a non-conductive state to isolate the match line ML from ground potential. The non-conductive state of transistor 422x isolates the first memory cell 410x from node Nx, thereby preventing the value of X from being pulled low to ground potential by the conductive NMOS transistor 423x. Similarly, the logic high state of CL turns on NMOS transistor 423y and turns off PMOS transistor 422y. The conductive state of transistor 423y pulls the gate of match line pull-down transistor 421y (e.g., at node Ny) low towards ground potential, thereby maintaining transistor 421y in a non-conductive state to isolate the match line ML from ground potential. The non-conductive state of transistor 422y isolates the second memory cell 410y from node Ny, thereby preventing the value of Y from being pulled low to ground potential by the conductive NMOS transistor 423y.

Then, during an evaluation phase of the compare operation, the comparand bit C is provided in a complementary manner to the XY CAM cell 400 via comparand lines CL and CLB. If a comparand line is driven to logic high, then the corresponding selective pull-down circuit 425 is disabled and does not discharge the match line ML. Conversely, if a comparand line is driven to logic low, then the corresponding selective pull-down circuit 425 is enabled and selectively discharges the match line ML in response to the corresponding data bit provided by the associated memory cell 410. If both CL and CLB are driven to logic high (e.g., to achieve a column-masking function), then both selective pull-down circuits 425x and 425y are disabled and together prevent the match line ML from discharging, thereby causing the CAM cell 400 to indicate a match condition on ML irrespective of the data value D.

For one example, if the comparand bit is logic high (e.g., C=1 and $\overline{C}$=0), then CL is driven to logic high and CLB is driven to logic low. The logic high state of CL disables the second selective pull-down circuit 425y (in the manner described above), and prevents the second data bit Y stored in second memory cell 410y from affecting the compare operation. The logic low state of CLB enables the first selective pull-down circuit 425x (in the manner described above), and allows the first data bit X stored in first memory cell 410x to selectively discharge the match line ML. Thus, if the data bit is logic high (e.g., D=1), as indicated by X=0 and Y=1, then the logic low value (X=0) output by first memory cell 410x propagates through pass gate 422x to node Nx. In response to X=0, NMOS pull-down transistor 421x does not turn on, and therefore the match line ML remains in its charged state to indicate the match condition between C=1 and D=1. Conversely, if the data bit is logic low (e.g., D=0), as indicated by X=1 and Y=0, then the logic high value (X=1) output by first memory cell 410x propagates through pass gate 422x to node Nx. In response to X=1, NMOS pull-down transistor 421x turns on and discharges the match line ML low toward ground potential to indicate the mismatch condition between C=1 and D=0.

The XY CAM cell 400 operates in a complementary manner for compare operations in which the comparand bit is logic low (e.g., C=0 and $\overline{C}$=1), where CL is driven to logic low and CLB is driven to logic high. More specifically, the logic low state of CL enables selective pull-down circuit 425y (in the manner described above), and allows the second data bit Y stored in second memory cell 410y to selectively discharge the match line ML. The logic high state of CLB disables selective pull-down circuit 425x (in the manner described above), and prevents the first data bit X stored in first memory cell 410x from affecting the compare operation. Thus, if the data bit is logic low (e.g., D=0), as indicated by X=1 and Y=0, then the logic low value (Y=0) output by second memory cell 410y propagates through pass gate 422y to node Ny. In response to Y=0, NMOS pull-down transistor 421y does not turn on, and therefore the match line ML remains in its charged state to indicate the match condition between C=0 and D=0. Conversely, if the data bit is logic high (e.g., D=1), as indicated by X=0 and Y=1, then the logic high value (Y=1) output by second memory cell 410y propagates through pass gate 422y to node Ny. In response to Y=1, NMOS pull-down transistor 421y turns on and discharges the match line ML low toward ground potential to indicate the mismatch condition between C=0 and D=1.

In accordance with the present embodiments, the compare circuit 420 of XY CAM cell 400 includes only one transistor (e.g., transistor 421) in each pull-down path between the match line and ground potential, as shown in FIG. 4. In contrast, the conventional XY CAM cell 100 of FIG. 1A includes two series-connected transistors (e.g., transistors 131-132 and 133-134) in each pull-down path between the match line and ground potential. As a result, the XY CAM cell 400 of present embodiments is faster than the conventional XY CAM cell 100 of FIG. 1A. More specifically, because the compare circuit 420 employs single stack pull-down elements between the match line and ground potential, the XY CAM cell 400 puts less pull-down resistance and less capacitive loading on the match line than the 2-stack pull-down elements employed in the conventional XY CAM cell 100, and therefore is faster than conventional XY CAM cell 100. Further, because each CAM cell 400 puts less capacitive loading on the match line, a CAM array such as CAM array 210 of FIG. 2 can employ more CAM cells 400 in each row without degrading performance, as compared to conventional CAM cells 100. Further, the reduced match line capacitance resulting from fewer pull-down transistors in the compare stack of CAM cell 400 may reduce power consumption, as compared with conventional XY CAM cells 100 of FIG. 1A.

Figure 5:
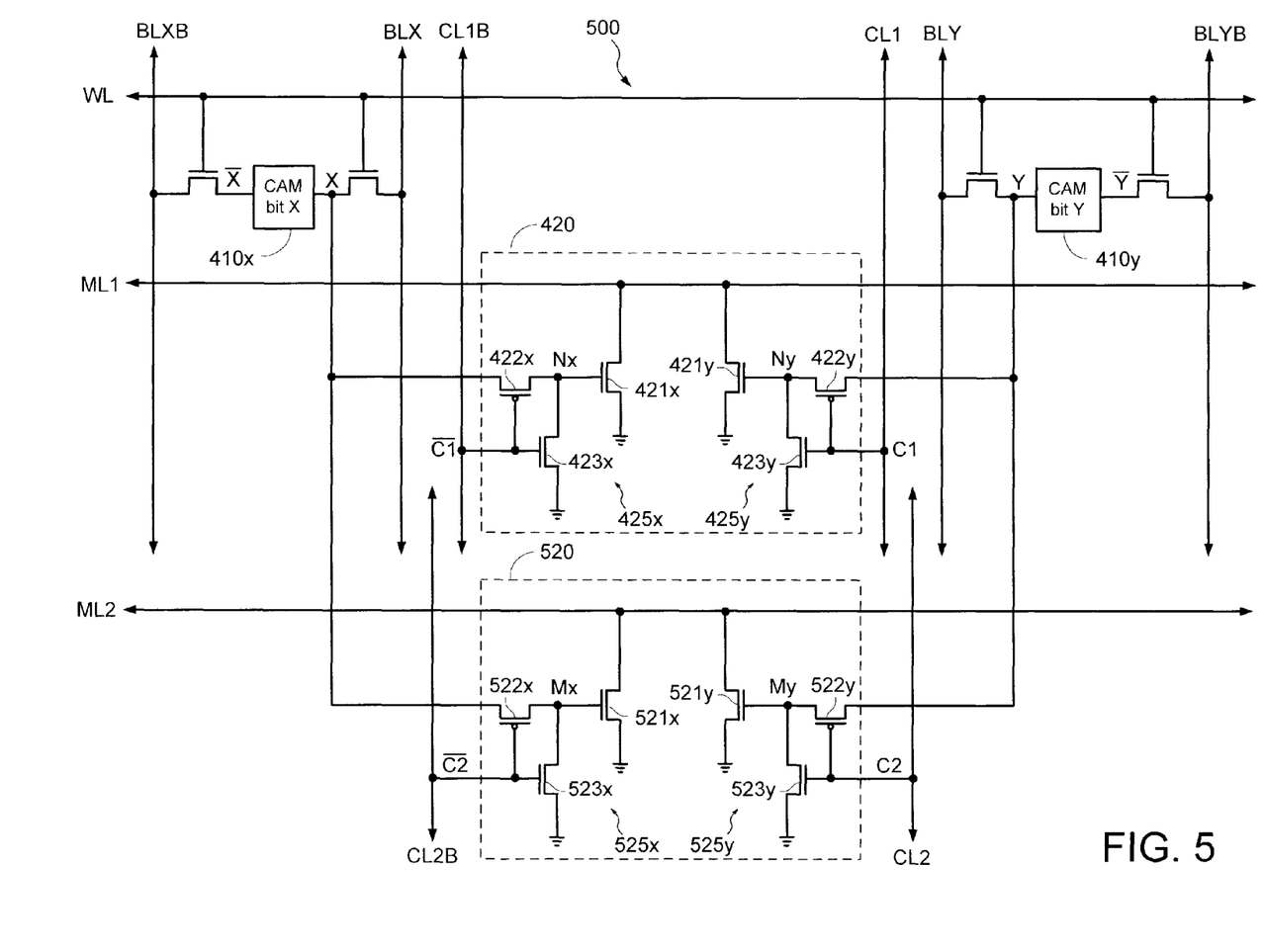
FIG. 5 is a block diagram of an XY CAM cell according to other embodiments.

FIG. 5 shows an XY CAM cell 500 in accordance with other embodiments. The XY CAM cell 500 is modified to include a second compare circuit 520 that allows CAM cell 500 to perform two compare operations with the data value D stored therein at the same time, or alternatively in a sequential (e.g., staggered) manner. More specifically, the XY CAM cell 500 can simultaneously compare the data value D with a first comparand bit (C1) provided on a first pair of complementary comparand lines CL1/CL1B and with a second comparand bit (C2) provided on a second pair of complementary comparand lines CL2/CL2B, where the first pair of complementary comparand lines CL1/CL1B provide the first comparand bit C1 and its complement $\overline{C1}$ to the first compare circuit 420, and the second pair of complementary comparand lines CL2/CL2B provide the second comparand bit C2 and its complement $\overline{C2}$ to the second compare circuit 520. Match conditions between the data value D and the first comparand bit C1 are provided on a first match line ML1 by the first compare circuit 420, and match conditions between the data value D and the second comparand bit C2 are provided on a second match line ML2 by the second compare circuit 520.

The second compare circuit 520 includes two match line pull-down transistors 521x and 521y, two pass transistors 522x and 522y, and two gating transistors 523x and 523y. A first group of transistors 521x, 522x, and 523x form a first selective pull-down circuit 525x that selectively discharges the second match line ML2 in response to a comparison with the complemented second comparand bit ($\overline{C2}$) and the first data bit (X), and a second group of transistors 521y, 522y, and 523y form a second selective pull-down circuit 525y that selectively discharges the second match line ML2 in response to a comparison with the second comparand bit (C2) and the second data bit (Y).

More specifically, for the first selective pull-down circuit 525x, the NMOS match line pull-down transistor 521x is coupled between the second match line ML2 and ground potential, and has a gate tied to a third node (Mx) that, in turn, is selectively coupled to receive X from the first memory cell 410x via the PMOS pass transistor 522x. The NMOS gating transistor 523x is coupled between the gate of match line pull-down transistor 521x and ground potential. The common gates of transistors 522x and 523x are coupled to the second complementary comparand line CL2B, and receive the complemented second comparand bit ($\overline{C2}$) during compare operations. For the second selective pull-down circuit 525y, the NMOS match line pull-down transistor 521y is coupled between the second match line ML2 and ground potential, and has a gate tied to a fourth node (My) that, in turn, is selectively coupled to receive Y from the second memory cell 410y via the PMOS pass transistor 522y. The NMOS gating transistor 523y is coupled between the gate of match line pull-down transistor 521y and ground potential. The common gates of transistors 522y and 523y are coupled to the second comparand line CL2, and receive the second comparand bit (C2) during compare operations.

Compare operations for XY CAM cell 500 are performed in a manner similar to that described above with respect to CAM cell 400 of FIG. 4, except that XY CAM cell 500 can perform two compare operations at the same time (or alternately in a sequential or staggered manner). Thus, during the pre-charge phase of the compare operation, the first and second match lines ML1 and ML2 are both pre-charged to logic high (e.g., towards VDD) by suitable pre-charge circuits (not shown for simplicity), and the both sets of complementary comparand lines CL1/CL1B and CL2/CL2B are pre-charged to logic high (e.g., towards VDD). In this manner, during the pre-charge phase, the first compare circuit 420 isolates the first match line ML1 from ground potential, and the second compare circuit 520 isolates the second match line ML2 from ground potential.

Then, during the evaluation phase of the compare operation, the first comparand bit C1 is provided to the XY CAM cell 500 in a complementary manner via comparand lines CL1 and CL1B, and the second comparand bit C2 is provided to the XY CAM cell 500 in a complementary manner via comparand lines CL2 and CL2B. If a comparand line is driven to logic high, then the corresponding selective pull-down circuit 425/525 is disabled and does not discharge its associated match line ML. Conversely, if a comparand line is driven to logic low, then the corresponding selective pull-down circuit 425/525 is enabled and selectively discharges its associated match line ML in response to the corresponding data bit provided by the associated memory cell 410. More specifically, if both CL1 and CL1B are driven to logic high (e.g., to achieve a column-masking function), then both selective pull-down circuits 425$x$ and 425$y$ are disabled and together prevent the first match line ML1 from discharging, thereby causing the CAM cell 500 to indicate a match condition on ML1 irrespective of the data value D. Similarly, if both CL2 and CL2B are driven to logic high (e.g., to achieve a column-masking function), then both selective pull-down circuits 525$x$ and 525$y$ are disabled and together prevent the second match line ML2 from discharging, thereby causing the CAM cell 500 to indicate a match condition on ML2 irrespective of the data value D.

Similar to the first compare circuit 420, the second compare circuit 520 of XY CAM cell 500 includes only one transistor (e.g., transistor 521) in each pull-down path between the second match line ML2 and ground potential, as shown in FIG. 5. In contrast, the conventional XY CAM cell 100 of FIG. 1A includes two series-connected transistors (e.g., transistors 131-132 and 133-134) in each pull-down path between the match line and ground potential. As a result, the XY CAM cell 500 of present embodiments is faster than the conventional XY CAM cell 100 of FIG. 1A. More specifically, because the compare circuit 520 employs single stack pull-down elements between the second match line ML2 and ground potential, the compare circuit 520 puts less pull-down resistance and less capacitive loading on the match line than the 2-stack pull-down elements employed in the conventional XY CAM cell 100, and therefore is faster and may even consume less power than conventional XY CAM cell 100. Further, because each CAM cell 500 puts less capacitive loading on each of the match lines ML1 and ML2, a CAM array such as CAM array of FIG. 2 can employ more CAM cells 500 in each row without degrading performance, as compared to conventional CAM cells 100.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A quaternary content addressable memory (CAM) cell for storing a data value having one of four possible states represented by first and second data bits, the CAM cell comprising:
   first and second memory cells for storing the first and second data bits, respectively;
   a first match line; and
   a first compare circuit coupled to the first and second memory cells and the match line, and configured to discharge the first match line through one of two parallel paths between the first match line and ground potential if there is a mismatch condition between a first comparand bit and the data value, wherein each of the two parallel paths between the first match line and ground potential in the CAM cell consists of a single transistor.

2. The CAM cell of claim 1, wherein the first compare circuit comprises:
   a first pull-down transistor connected between the first match line and ground potential, and having a gate responsive to a logical combination of the first comparand bit and the first data bit; and
   a second pull-down transistor connected between the first match line and ground potential, and having a gate responsive to a logical combination of a complement of the first comparand bit and the second data bit, wherein the first and second pull-down transistors are in parallel with each other.

3. The CAM cell of claim 2, wherein the first compare circuit further comprises:
   a first pass transistor connected between the first memory cell and the gate of the first pull-down transistor, and having a gate to receive the first comparand bit;
   a first gating transistor coupled between the gate of the first pull-down transistor and ground potential, and having a gate to receive the first comparand bit;
   a second pass transistor connected between the second memory cell and the gate of the second pull-down transistor, and having a gate to receive the complemented first comparand bit; and
   a second gating transistor coupled between the gate of the second pull-down transistor and ground potential, and having a gate to receive the complemented first comparand bit.

4. The CAM cell of claim 3, wherein:
   the first and second pull-down transistors are NMOS transistors;
   the first and second gating transistors are NMOS transistors; and
   the first and second pass transistors are PMOS transistors.

5. The CAM cell of claim 1, wherein the first compare circuit comprises:

a first pull-down transistor connected between the first match line and ground potential, and having a gate;

a first pass transistor connected between the first memory cell and the gate of the first pull-down transistor, and having a gate to receive the first comparand bit; and a first gating transistor coupled between the gate of the first pull-down transistor and ground potential, and having a gate to receive the first comparand bit.

6. The CAM cell of claim 5, wherein the first compare circuit further comprises:

a second pull-down transistor connected between the first match line and ground potential, and having a gate;

a second pass transistor connected between the second memory cell and the gate of the second pull-down transistor, and having a gate to receive a complemented first comparand bit; and a second gating transistor coupled between the gate of the second pull-down transistor and ground potential, and having a gate to receive the complemented first comparand bit.

7. The CAM cell of claim 1, further comprising:

a second match line; and a second compare circuit coupled to the first and second memory cells and the second match line, and configured to discharge the second match line through one of two parallel paths between the second match line and ground potential if there is a mismatch condition between a second comparand bit and the data value, wherein each of the two parallel paths between the second match line and ground potential in the CAM cell consists of a single transistor.

8. The CAM cell of claim 7, wherein the first and second compare circuits compare the data value with the first and second comparand bits, respectively, at the same time.

9. The CAM cell of claim 7, wherein the first and second compare circuits compare the data value with the first and second comparand bits, respectively, in a sequential manner.

10. A quaternary content addressable memory (CAM) cell for storing a data value having one of four possible states represented by first and second data bits, the CAM cell comprising:

first and second memory cells for storing the first and second data bits, respectively;

a match line; and a compare circuit for comparing a comparand bit with the data value, the compare circuit comprising:

a first pull-down transistor connected between the match line and ground potential, and having a gate;

a first pass transistor connected between the first memory cell and the gate of the first pull-down transistor, and having a gate to receive the comparand bit; and a first gating transistor coupled between the gate of the first pull-down transistor and ground potential, and having a gate to receive the comparand bit.

11. The CAM cell of claim 10, wherein the first data bit is selectively provided to the gate of the first pull-down transistor in response to the comparand bit.

12. The CAM cell of claim 10, wherein the compare circuit further comprises:

a second pull-down transistor connected between the match line and ground potential, and having a gate;

a second pass transistor connected between the second memory cell and the gate of the second pull-down transistor, and having a gate to receive a complemented comparand bit; and a second gating transistor coupled between the gate of the second pull-down transistor and ground potential, and having a gate to receive the complemented comparand bit.

13. The CAM cell of claim 12, wherein the second data bit is selectively provided to the gate of the second pull-down transistor in response to a complemented comparand bit.

14. The CAM cell of claim 12, wherein:

the first and second pull-down transistors are NMOS transistors;

the first and second gating transistors are NMOS transistors; and the first and second pass transistors are PMOS transistors.

15. A quaternary content addressable memory (CAM) cell for storing a data value having one of four possible states represented by first and second data bits, the CAM cell comprising:

first and second memory cells for storing the first and second data bits, respectively;

a match line to indicate a match condition in response to compare operations between the data value and a comparand bit; and a compare circuit coupled to the first and second memory cells and the match line, and comprising:

a first pull-down transistor connected between the match line and ground potential, and having a gate that selectively receives the first data bit in response to the comparand bit; and a second pull-down transistor connected between the match line and ground potential, and having a gate that selectively receives the second data bit in response to a complemented comparand bit, wherein the first and second pull-down transistors are in parallel with each other.

16. The CAM cell of claim 15, wherein the compare circuit further comprises:

a first pass transistor connected between the first memory cell and the gate of the first pull-down transistor, and having a gate to receive the comparand bit;

a first gating transistor coupled between the gate of the first pull-down transistor and ground potential, and having a gate to receive the comparand bit;

a second pass transistor connected between the second memory cell and the gate of the second pull-down transistor, and having a gate to receive the complemented comparand bit; and a second gating transistor coupled between the gate of the second pull-down transistor and ground potential, and having a gate to receive the complemented comparand bit.

17. The CAM cell of claim 16, wherein:

the first and second pull-down transistors are NMOS transistors;

the first and second gating transistors are NMOS transistors; and the first and second pass transistors are PMOS transistors.

* * * * *